(12) United States Patent
Wang et al.

(10) Patent No.: US 11,489,020 B2
(45) Date of Patent: Nov. 1, 2022

(54) OPTICAL SENSOR DEVICE, METHOD FOR FABRICATING THE SAME, DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 120 days.

(21) Appl. No.: 16/759,832

(22) PCT Filed: Jun. 11, 2019

(86) PCT No.: PCT/CN2019/090651
§ 371 (c)(1),
(2) Date: Apr. 28, 2020

(87) PCT Pub. No.: WO2019/238026
PCT Pub. Date: Dec. 19, 2019

(65) Prior Publication Data
US 2020/0335554 A1    Oct. 22, 2020

(30) Foreign Application Priority Data

Jun. 11, 2018   (CN) .......................... 201810594582.9

(51) Int. Cl.
*H01L 27/32* (2006.01)
*H01L 27/22* (2006.01)
(Continued)

(52) U.S. Cl.
CPC .......... *H01L 27/322* (2013.01); *H01L 27/228* (2013.01); *H01L 27/3227* (2013.01);
(Continued)

(58) Field of Classification Search
CPC ... H01L 27/3227; H01L 27/288; H01L 31/14; H01L 31/16; H01L 31/173
See application file for complete search history.

(56) References Cited

U.S. PATENT DOCUMENTS 8,933,868 B2 * 1/2015 Choi ................... G09G 3/3208
                                                                                345/82
2003/0089929 A1    5/2003 Rhodes
(Continued)

FOREIGN PATENT DOCUMENTS

CN        103000823 A     3/2013
CN        103311265 A     9/2013
(Continued)

OTHER PUBLICATIONS

"First Office Action and English language translation", CN Application No. 201810594582.9, dated Jun. 26, 2019, 12 pp.
(Continued)

*Primary Examiner* — David A Zarneke
(74) *Attorney, Agent, or Firm* — Myers Bigel, P.A.

(57) ABSTRACT

An optical sensor device, a method for fabricating the same, and a display device are disclosed. The optical sensor device includes a display region and a non-display region. In the display non-display region, the optical sensor device includes a thin film transistor, including an active layer, a gate insulating layer, a gate layer, a source and drain layer, and an interlayer dielectric layer. In the non-display display region, the optical sensor device includes a first insulating layer, a conductive layer and a second insulating layer which are stacked sequentially. The conductive layer is arranged in a same layer as the source and drain layer or the gate layer. In the non-display display region, the first insulating layer is
(Continued)

provided with a first through-hole, and the optical sensor device further includes a photo-sensitive device in the first through-hole.

20 Claims, 4 Drawing Sheets (51) Int. Cl.
*H01L 31/173* (2006.01)
*H01L 31/16* (2006.01)
*H01L 31/14* (2006.01)

(52) U.S. Cl.
CPC .......... *H01L 27/3248* (2013.01); *H01L 31/14* (2013.01); *H01L 31/16* (2013.01); *H01L 31/173* (2013.01)

(56) References Cited

U.S. PATENT DOCUMENTS

| | | | | |
|---|---|---|---|---|
| 2013/0075761 | A1* | 3/2013 | Akiyama | H01L 31/167 257/E31.095 |
| 2015/0187830 | A1* | 7/2015 | Dai | G02F 1/136227 257/53 |
| 2015/0349016 | A1 | 12/2015 | Ham et al. | |
| 2016/0365381 | A1 | 12/2016 | Zhao | |
| 2018/0342691 | A1 | 11/2018 | Lu | |

FOREIGN PATENT DOCUMENTS

| | | |
|---|---|---|
| CN | 104022181 A | 9/2014 |
| CN | 104681655 A | 6/2015 |
| CN | 105789226 A | 7/2016 |
| CN | 106684202 A | 5/2017 |
| CN | 106941108 A | 7/2017 |
| CN | 107611159 A | 1/2018 |
| CN | 107978609 A | 5/2018 |
| CN | 108807556 A | 11/2018 |

OTHER PUBLICATIONS

"International Search Report and English language translation", International Application No. PCT/CN2019/090651, dated Aug. 26, 2019, 7 pp.

"Second Office Action and English language translation", CN Application No. 201810594582.9, dated Nov. 13, 2019, 13 pp.

"Third Office Action and English language translation", CN Application No. 201810594582.9, dated Jul. 2, 2020, 12 pp.

* cited by examiner

OPTICAL SENSOR DEVICE, METHOD FOR FABRICATING THE SAME, DISPLAY DEVICE

RELATED APPLICATIONS

The present application is a 35 U.S.C. 371 national stage application of PCT International Application No. PCT/CN2019/090651, filed on Jun. 11, 2019, which claims the benefit of Chinese Patent Application No. 201810594582.9, filed on Jun. 11, 2018, the entire disclosures of which are incorporated herein by reference.

TECHNICAL FIELD

The present disclosure generally relates to display technologies, and particularly to an optical sensor device, a method for fabricating the same, and a display device.

BACKGROUND

In an existing circuit compensation solution, electrical compensation is utilized. It can only compensate the display Mura (a phenomenon in which display traces are formed due to uniform brightness of the display) due to variation of the threshold voltage and mobility of a TFT (Thin Film Transistor), but can not compensate the variation in brightness due to aging of an OLED device. Although the panel as a whole can be subject to optical compensation before delivery, Mura due to decay of the EL (electroluminescence) efficiency can not be overcome. Namely, it is impossible to realize real-time optical compensation. Thus, it is required to introduce an optical sensor for in-built compensation. In this case, a PD (photo diode, e.g., a PIN type photo diode) is added in an organic light-emitting diode (OLED) display device, which is used for monitor the variation in the brightness of EL in a real-time manner, and the panel is subject to real-time optical compensation by means of calculation with the peripheral IC (integrated circuit).

Generally, a photo-sensitive device like a PD is formed during fabrication of the TFT. After forming the PD, the wet etching process in the subsequent procedure for the TFT will damage a sidewall of the PD. This causes the leakage current of the PD to increase, and affects performance of the display device.

SUMMARY

In a first aspect, embodiments of the present disclosure provide an optical sensor device comprising a display region and a non-display region. In the non-display region, the optical sensor device comprises a thin film transistor, the thin film transistor comprises an active layer, a gate insulating layer, a gate layer, a source and drain layer, and an interlayer dielectric layer, the gate insulating layer is configured to insulate the active layer from the gate layer, and the interlayer dielectric layer is configured to insulate the gate layer from the source and drain layer. In the non display region, the optical sensor device comprises a first insulating layer, a conductive layer and a second insulating layer which are stacked in this order, and the conductive layer is arranged in a same layer as the source and drain layer or the gate layer. In the display region, the first insulating layer is provided with a first through-hole, the optical sensor device further comprises a photo-sensitive device, and the photo-sensitive device is arranged in the first through-hole.

In one or more embodiments, the conductive layer covers a bottom and a sidewall of the first through-hole, and the second insulating layer at least covers a portion of the conductive layer which covers the sidewall of the first through-hole, and forms a groove, and the photo-sensitive device is arranged in the groove.

In one or more embodiments, a depth of the groove is smaller than or equal to a thickness of the photo-sensitive device.

In one or more embodiments, the optical sensor device further comprises a buffer layer on the substrate in the display region and the non-display region, and the first through-hole penetrates all thickness of the first insulating layer and at least partial thickness of the buffer layer.

In one or more embodiments, the optical sensor device is a PIN type photo diode, and comprises an N type layer, an I type layer and a P type layer of a semiconductor material which are stacked in this order.

In one or more embodiments, the N type layer of the semiconductor material is electrically connected with the conductive layer.

In one or more embodiments, the conductive layer and the source and drain layer are arranged in a same layer, and the first insulating layer and the interlayer dielectric layer are arranged in a same layer.

In one or more embodiments, the optical sensor device further comprises a first passivation layer in the non-display region which covers the source and drain layer, and the second insulating layer and the first passivation layer are arranged in a same layer.

In one or more embodiments, the conductive layer the conductive layer is formed as an integral part with a source layer or a drain layer of the source and drain layer.

In one or more embodiments, the conductive layer and the gate layer are arranged in a same layer, the first insulating layer and the gate insulating layer are arranged in a same layer, and the second insulating layer and the interlayer dielectric layer are arranged in a same layer.

In a second aspect, embodiments of the present disclosure provide a display device, comprising the optical sensor device as described above.

In one or more embodiments, the display device further comprises:
a black matrix, which is on the optical sensor device and defines the display region;
a color filter layer, which is in the display region, covers the photo-sensitive device and partially covers the black matrix;
an overcoating layer, which is on the black matrix and the color filter layer;
a photo spacer layer, which is in the non-display region and on the overcoating layer;
an auxiliary electrode, which is on the photo spacer layer; and
a transparent cathode, which covers the auxiliary electrode, the photo spacer layer and the overcoating layer, and is electrically connected with the auxiliary electrode.

In a third aspect, embodiments of the present disclosure provide a method for fabricating an optical sensor device. The optical sensor device comprises a display region and a non-display region. The method comprises:
in the non-display region, forming an active layer, a gate insulating layer, a gate layer, a source and drain layer and an interlayer dielectric layer in this order, to form a thin film transistor, the gate insulating layer being configured to insulate the active layer from the gate layer, and the interlayer dielectric layer being configured to insulate the gate layer from the source and drain layer, and in the display region, forming a first insulating layer, forming a first through-hole in the first insulating layer, forming a conductive layer and a second insulating layer, and forming a photo-sensitive device in the first through-hole, wherein the conductive layer is arranged in a same layer as the source and drain layer or the gate layer.

In one or more embodiments, forming the conductive layer comprises, forming the conductive layer to cover a bottom and a sidewall of the first through-hole, wherein forming the second insulating layer comprises, forming the second insulating layer to at least cover a portion of the conductive layer which covers the sidewall of the first through-hole, and forming a groove, and wherein forming the photo-sensitive device comprises, forming the photo-sensitive device in the groove.

In one or more embodiments, the method further comprises: prior to forming the active layer, forming a buffer layer on a substrate in the display region and the non-display region, and wherein forming the first through-hole comprises, forming the first through-hole to penetrate all thickness of the first insulating layer and at least partial thickness of the buffer layer.

In one or more embodiments, the conductive layer and the source and drain layer are arranged in a same layer, and the first insulating layer and the interlayer dielectric layer are arranged in a same layer.

In one or more embodiments, forming the source and drain layer after forming the photo-sensitive device.

In one or more embodiments, the conductive layer and the gate layer are arranged in a same layer, the first insulating layer and the gate insulating layer are arranged in a same layer, and the second insulating layer and the interlayer dielectric layer are arranged in a same layer.

In one or more embodiments, a depth of the groove is smaller than or equal to a thickness of the photo-sensitive device.

In one or more embodiments, forming the photo-sensitive device comprises: depositing an N type layer, an I type layer and a P type layer of a semiconductor material in this order;

depositing a first transparent conductive layer on the P type layer; and patterning the N type layer, the I type layer and the P type layer of the semiconductor material and the first transparent conductive layer, to form the photo-sensitive device.

The display device is a top emitting display device or a bottom emitting display device.

BRIEF DESCRIPTION OF THE DRAWINGS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

It is noted that, in the present disclosure, embodiments as well as features in embodiments can be combined with each other without conflict. The present disclosure is neither limited to any single aspect, nor to any single embodiment. The present disclosure will be described in detail with reference to the accompanying drawings and embodiments.

Figure 1:
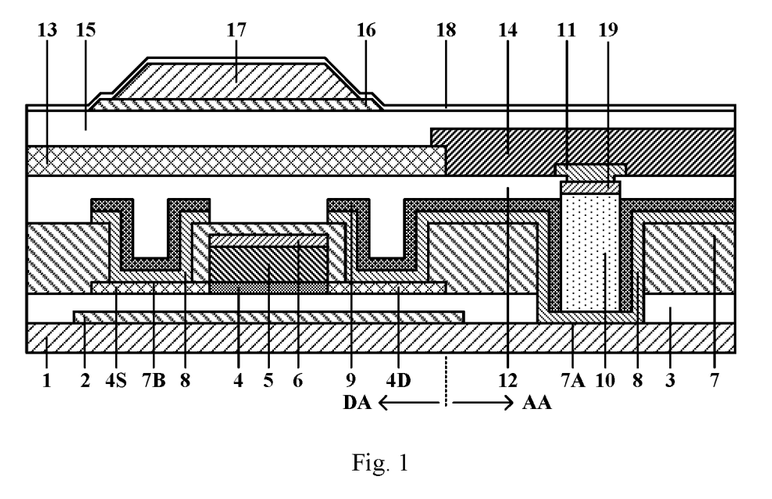
FIG. 1 is a structural view for illustrating an optical sensor device in an embodiment of the present disclosure.

As shown in FIG. 1, embodiments of the present disclosure provide an optical sensor device, comprising a display region AA and a non-display region DA. The optical sensor device comprises a substrate 1, such as glass or resin. In the non-display region DA, the optical sensor device comprises a TFT which is formed on the substrate 1. The TFT comprises an active layer 4, a gate layer 6 and a source and drain layer 8.

In an exemplary embodiment, the optical sensor device comprises a light shield layer 2 which is arranged between the substrate 1 and the TFT. An orthogonal projection of the active layer 4 of the TFT on the substrate 1 falls within an orthogonal projection of the light shield layer 2 on the substrate 1. This reduces or avoids a burning effect of light on the active layer. Thus, an off-state current (i.e., a leakage current) of the TFT is reduced, and the display quality is improved.

In an exemplary embodiment, the optical sensor device comprises a buffer layer 3 on the substrate 1. As shown in FIG. 1, the buffer layer 3 covers the light shield layer 2 and the substrate 1. For example, the buffer layer 3 comprises an insulating material such as silicon oxide, silicon nitride, and silicon oxynitride.

For purpose of reducing a contact resistance between the active layer 4 and the source and drain layer 8 and improving performance of the TFT, the active layer 4 comprises ohmic contact regions for contacting the source and drain layer 8, i.e., a source contact region 4S and a drain contact region 4D.

For example, the TFT further comprises a gate insulating layer 5 and an interlayer dielectric layer 7. The gate insulating layer 5 is arranged above the active layer 4, the gate layer 6 is arranged above the gate insulating layer 5, and the interlayer dielectric layer 7 is arranged above the gate layer 6. The source and drain layer 8 is arranged above the interlayer dielectric layer 7, and is electrically connected with the active layer 4 through a second through-hole 7B, i.e., electrically connected with the source contact region 4S and the drain contact region 4D as described above, respectively. In the exemplary embodiment shown in FIG. 1, the second through-hole 7B penetrates the interlayer dielectric layer 7.

For example, the TFT further comprises a first passivation layer 9 and a second passivation layer 12. The first passivation layer 9 covers a surface of the source and drain layer 8. The second passivation layer 12 covers the first passivation layer 9, and provides a substantially flat surface.

In the display region AA, the optical sensor device comprises a photo-sensitive device 10. In the display region AA, the optical sensor device comprises the buffer layer 3 and the interlayer dielectric layer 7 which are arranged on the substrate 1 in this order, and a first through-hole 7A which penetrates the buffer layer 3 and the interlayer dielectric layer 7. The source and drain layer 8 covers a bottom and a sidewall of the first through-hole 7A. The first passivation layer 9 at least covers a portion of the source and drain layer 8 which covers the sidewall of the first through-hole 7A, and thus forms a groove for accommodating the photo-sensitive device 10. The photo-sensitive device 10 fills up the groove. Namely, the photo-sensitive device 10 is arranged on the source and drain layer 8 in the groove, and the first passivation layer 9 is arranged between the photo-sensitive device 10 and the source and drain layer 8 which covers the sidewall of the first through-hole 7A.

Since the photo-sensitive device 10 is arranged in the groove formed by the first through-hole 7A, the photo-sensitive device 10 is protected by a metal of the source and drain layer 8. In this way, the effect of the ambient light on the off-state current of the photo-sensitive device is avoided. Since the first passivation layer 9 provides protection for the sidewall of the photo-sensitive device 10, in subsequent processes of fabricating the TFT, the sidewall of the photo-sensitive device 10 will not be damaged. This improves the performance of the display device. By providing the optical sensor device with the photo-sensitive device and the control TFT for optical compensation in the display device, real-time optical compensation can be realized. This effectively restrains the display Mura due to variation in brightness of the EL device, and increases the display effect.

The photo-sensitive device 10 further comprises a first transparent conductive layer 19 and a second transparent conductive layer 11. The second transparent conductive layer 11 is electrically connected with the first transparent conductive layer 19 through a via which penetrates the second passivation layer 12, and acts as a wiring for the first transparent conductive layer 19.

In embodiments of the present disclosure, a depth of the groove is smaller than or equal to a thickness of the photo-sensitive device. In case the depth of the groove is larger than or equal to the thickness of the photo-sensitive device, the groove can better protect the sidewall of the photo-sensitive device. In case the depth of the groove is larger than the thickness of the photo-sensitive device, a short circuit tends to form between the first transparent conductive layer 19 over the photo-sensitive device and the source and drain layer 8. In case it the depth of the groove equal to the thickness of the photo-sensitive device is difficult to realize, the depth of the groove can be slightly smaller than the thickness of the photo-sensitive device.

In case the thickness of the interlayer dielectric layer 7 is smaller than the thickness of the photo-sensitive device 10, after all thickness of the interlayer dielectric layer 7 is removed, all or partial thickness of the buffer layer 3 can be further removed, so as to increase the depth of the first through-hole 7A. This further increases the depth of the groove. Namely, the first through-hole 7A can penetrate a partial thickness of the interlayer dielectric layer 7, penetrate all thickness of the interlayer dielectric layer 7, penetrate all thickness of the interlayer dielectric layer 7 and a partial thickness of the buffer layer 3, or penetrate all thickness of the interlayer dielectric layer 7 and all thickness of the buffer layer 3(i.e., the case shown in FIG. 1).

Still referring to FIG. 1, the optical sensor device further comprises a black matrix (Black Matrix, BM) 13 above the TFT. The black matrix 13 defines the non-display region DA and surrounds the display region AA. In other words, the black matrix 13 defines the display region AA. The optical sensor device further comprises a color filter layer 14 which is in the display region AA and above the photo-sensitive device 10. The color filter layer 14 comprises three or more color filter units, for example R, G, B color filter units, so as to provide respective primary colors to realize a colored display.

The optical sensor device further comprises an overcoating layer 15. The overcoating layer 15 comprises a planarization material like resin, SOG (Silicon On Glass, i.e., a silicon—glass bonding structure material) and BCB (benzocyclobutene), and covers the black matrix 13 and the color filter layer 14 to provide a substantially flat upper surface.

The optical sensor device further comprises for example an auxiliary electrode 16 in the non-display region DA, a photo spacer 17 above the auxiliary electrode 16, and a cathode 18. The cathode 18 covers a stack of the auxiliary electrode 16 and the photo spacer 17, and covers the remaining surface of The overcoating layer 15. The auxiliary electrode 16 comprises a common metal like Mo, Al, Ti, Au, Cu, Hf, Ta, or an alloy thereof, such as AlNd, MoNb. The auxiliary electrode 16 can also be a multiple layer metal, such as MoNb/Cu/MoNb, AlNd/Mo/AlNd. The auxiliary electrode 16 is electrically connected with the cathode 18. By means of the arrangement of the auxiliary electrode, the voltage drop of the display device due to the large resistance of a thin cathode can be reduced, so that the display device has excellent display uniformity.

Embodiments of the present disclosure further provide a method for fabricating an optical sensor device. The optical sensor device comprises a display region and a non-display region. The method comprises: forming an active layer, a gate insulating layer, a gate layer, a source and drain layer and an interlayer dielectric layer in this order in the display region, to form a thin film transistor. The gate insulating layer is configured to insulate the active layer from the gate layer, and the interlayer dielectric layer is configured to insulate the gate layer from the source and drain layer. The method further comprises: forming a first insulating layer in the non-display region, forming a first through-hole in the first insulating layer, forming a conductive layer and a second insulating layer, and forming a photo-sensitive device in the first through-hole, wherein the conductive layer is arranged in a same layer as the source and drain layer or the gate layer.

Figure 2:
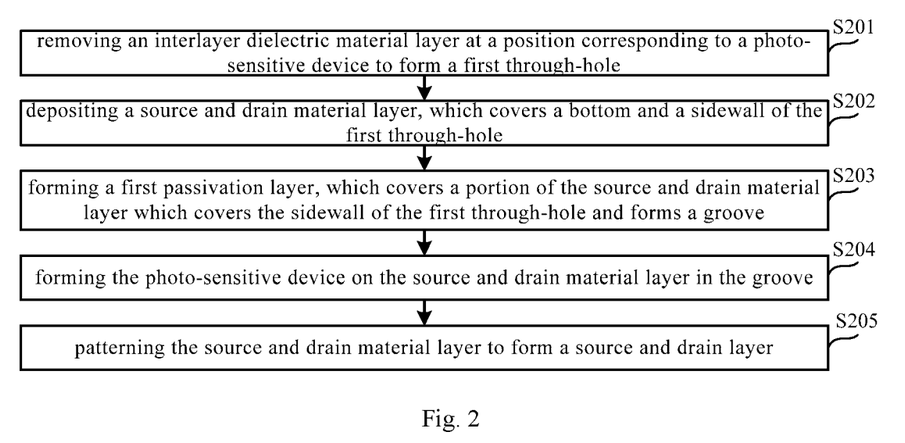
FIG. 2 is a flow chart for illustrating a method for fabricating an optical sensor device in an embodiment of the present disclosure.

Referring to FIG. 2, a method for fabricating the optical sensor device shown in FIG. 1 will be described in an exemplary manner. For example, the method comprises:

Step S201, removing an interlayer dielectric material layer at a position corresponding to a photo-sensitive device to form a first through-hole;

Step S202, depositing a source and drain material layer, which covers a bottom and a sidewall of the first through-hole;

Step S203, forming a first passivation layer on the source and drain material layer, wherein the first passivation layer at least covers a portion of the source and drain material layer which covers the sidewall of the first through-hole, and forms a groove;

Step S204, forming the photo-sensitive device on the source and drain material layer in the groove; and Step S205, patterning the source and drain material layer to form a source and drain layer.

The photo-sensitive device is arranged in the groove, and the sidewall of the photo-sensitive device is protected by the passivation layer. Thus, in the subsequent procedure for the TFT, the sidewall of the photo-sensitive device will not be damaged. This increases the performance of the display device, and increases the display effect.

Reference is made to an example in which the photo-sensitive device is a PIN type PD. The PD generally comprises a P type layer (a layer in which holes are carriers for conducting charges), an I type layer (an intrinsic layer) and an N type layer (a layer in which electrons are carriers for conducting charges) of a (same) semiconductor layer. The P type layer and the N type layer of the PD are generally formed by doping amorphous silicon. During doping, a lot of H (hydrogen) is introduced, which tends to diffuse into the TFT, and severely affects the performance of the TFT. In the above method, after forming the source and drain material layer and prior to patterning the source and drain material layer to form the source and drain layer, the photo-sensitive device is formed. Due to the shielding effect of the source and drain material layer, H is prevented from diffusing into the TFT, so that the performance of the display device is increased and the display effect is increased.

Further, the depth of the groove is equal to the thickness of the photo-sensitive device. In case the depth of the groove is equal to the thickness of the photo-sensitive device, the groove provides a superior protection for the photo-sensitive device. In case the depth of the groove equal to the thickness of the photo-sensitive device is difficult to realize, the depth of the groove can be slightly smaller than the thickness of the photo-sensitive device, so as to prevent a short circuit between the first transparent conductive layer and the source and drain layer.

Further, in case the interlayer dielectric layer has a thickness smaller than the thickness of the photo-sensitive device, removing all or partial thickness of the interlayer dielectric material layer at a position corresponding to the photo-sensitive device to form the groove comprises: removing all thickness of the interlayer dielectric material layer and all or partial thickness of the buffer layer material at a position corresponding to the photo-sensitive device, to form the groove.

Further, in step S204, forming the photo-sensitive device on the source and drain layer in the groove comprises:

depositing the N type layer, the I type layer and the P type layer of the semiconductor material in this order;

depositing the first transparent conductive layer on the P type layer; and patterning the N type layer, the I type layer, the P type layer and the first transparent conductive layer, to form the photo-sensitive device.

The N type layer, the I type layer, the P type layer and the first transparent conductive layer of the photo-sensitive device are deposited continuously, and patterning is realized by performing an etching process for one time. In this way, the process steps are simplified, and the cost is saved.

Figure 3:
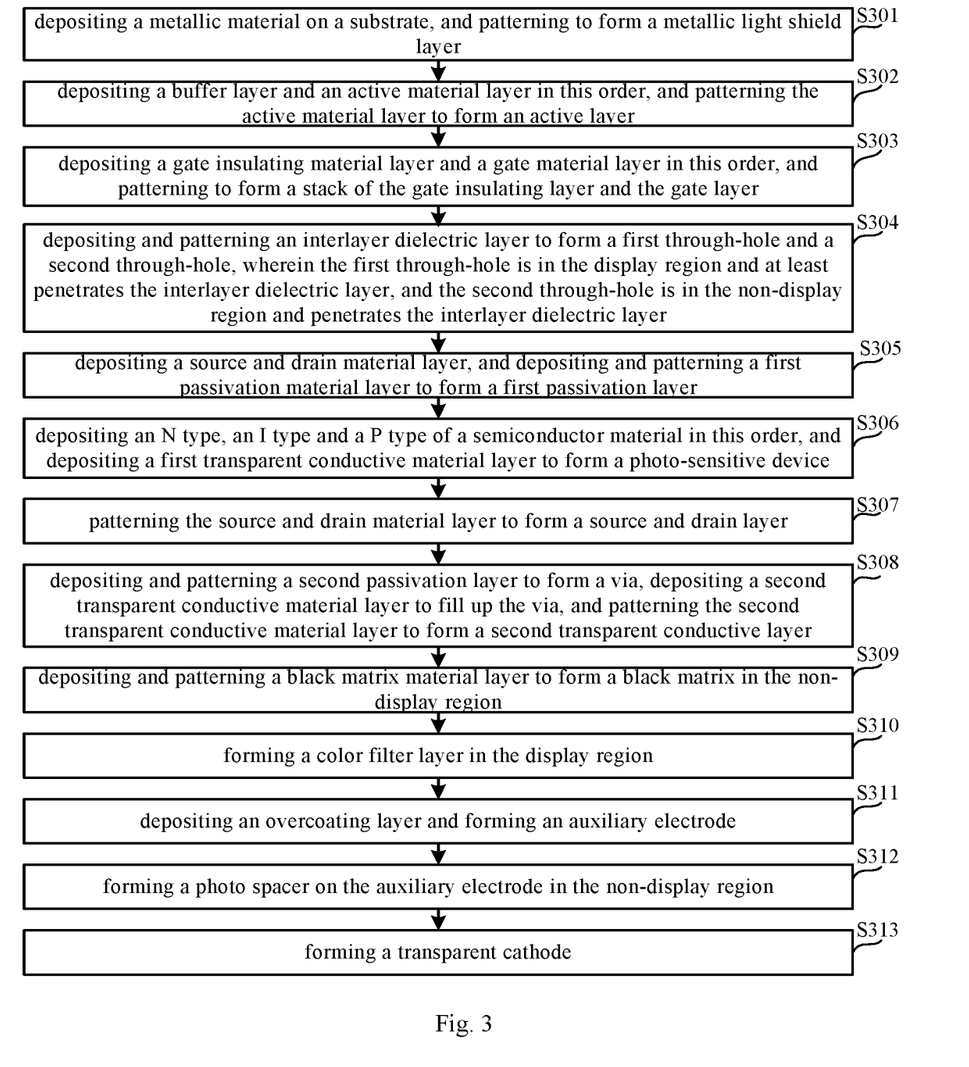
FIG. 3 is a flow chart for illustrating a method for fabricating an optical sensor device in a specific embodiment of the present disclosure.

The process for fabricating the optical sensor device will be described in detail hereinafter. As shown in FIG. 3, the process comprises the following steps S301-S308.

Figure 4A:
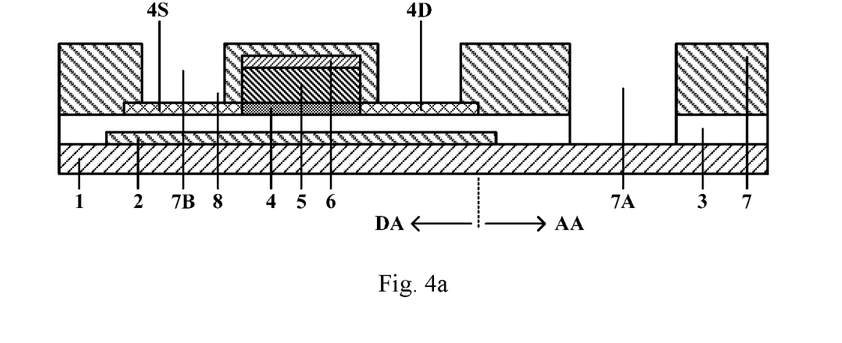
FIGS. 4a, 4b, 4c, 4d and 4e are structural views for illustrating an optical sensor device during fabricating in an embodiment of the present disclosure.

Step S301, as shown in FIG. 4a, a metallic material is deposited on the substrate 1, a photoresist is coated, and patterning is performed to form the metallic light shield layer 2 by etching. The metallic material can be a common metal like Mo, Al, Ti, Au, Cu, Hf, Ta, and can also be an alloy like AlNd, MoNb.

Step S302, as shown in FIG. 4a, the buffer layer 3 and the active material layer are deposited in this order, and the active material layer is patterned to form the active layer 4 by wet etching. The buffer layer 3 for example comprises an insulating material like silicon oxide, silicon nitride, silicon oxynitride. The active layer 4 for example comprises a metallic oxide material, such as IGZO.

Step S303, as shown in FIG. 4a, a gate insulating material layer and a gate material layer are deposited in this order, and a photoresist is coated. The gate material layer is etched by wet etching with a mask to form the gate layer 6. Then the gate layer 6 is used as a mask, and the gate insulating material layer is etched by dry etching to form the gate insulating layer 5, so as to form a stack of the gate insulating layer 5 and the gate layer 6. A material for the gate insulating layer 5 can be an insulating material like silicon oxide, silicon nitride, silicon oxynitride. A material for the gate layer 6 can be a common metal like Mo, Al, Ti, Au, Cu, Hf, Ta, and can also be an alloy formed by a Cu process, such as MoNd/Cu/MoNd.

Optionally, step S303 further comprises: by using the gate layer 6 as a mask, or by using the stack of the gate insulating layer 5 and the gate layer 6 as a mask, implanting ions into the exposed region of the active layer 4, to form an ohmic contact region of the active layer 4, i.e., the source contact region 4S and the drain contact region 4D.

Step S304, as shown in FIG. 4a, the interlayer dielectric layer 7 is deposited, and patterned to form the first through-hole 7A and the second through-hole 7B by photolithography. The first through-hole 7A is arranged in the display region AA, and formed in the interlayer dielectric layer 7. For example, in the embodiment shown in FIG. 4a, the first through-hole 7A penetrates the interlayer dielectric layer 7 and the buffer layer 3 to expose a surface of the substrate 1. The second through-hole 7B is arranged in the non-display region DA, penetrates the interlayer dielectric layer 7, and exposes the ohmic contact region of the active layer 4, i.e., the source contact region 4S and the drain contact region 4D.

Figure 4B:
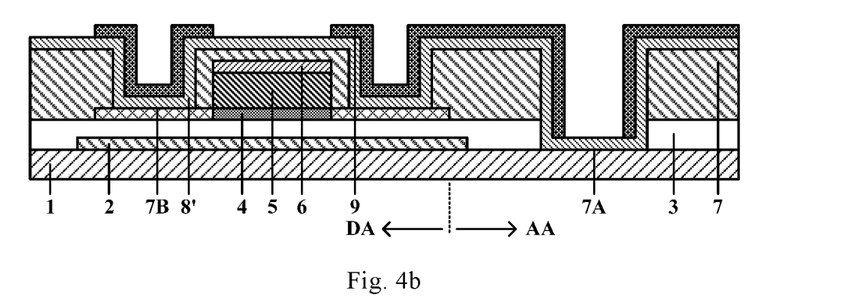

Step S305, as shown in FIG. 4b, a source and drain material layer 8' and a first passivation material layer are deposited in this order, and the first passivation material layer is patterned to form the first passivation layer 9. The source and drain material layer 8' covers the bottom and sidewall of the first through-hole 7A. The first passivation layer 9 at least covers a portion of the source and drain material layer 8' which covers the sidewall of the first through-hole 7A, so as to form the groove for accommodating the photo-sensitive device 10.

Figure 4C:
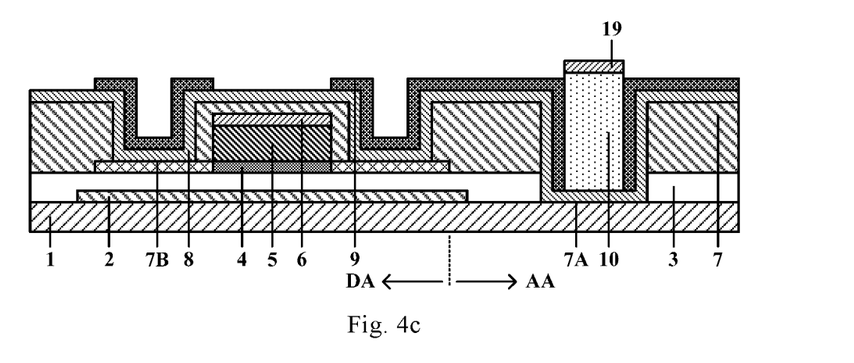

Step S306, as shown in FIG. 4c, the N type semiconductor layer, the I type semiconductor layer and the P type semiconductor layer of the PIN type photo-sensitive device 10 are deposited in this order by plasma enhanced chemical vapor deposition (PECVD). The semiconductor layer can be an inorganic semiconductor, or an organic semiconductor. The I type semiconductor layer is an intrinsic semiconductor layer. The N type semiconductor layer is a phosphor or arsenic doped semiconductor layer. The P type semiconductor layer is a boron doped semiconductor layer. Then, a first transparent conductive material layer is deposited. By using only one mask, a wet etching is performed and then a dry etching is performed during patterning, to form a patterned stack of the N type semiconductor layer, the I type semiconductor layer and the P type semiconductor layer of the photo-sensitive device 10, and the first transparent conductive layer 19 which is on and electrically connected with the photo-sensitive device 10. The first transparent conductive layer 19 acts as an electrode of the photo-sensitive device 10.

Figure 4D:
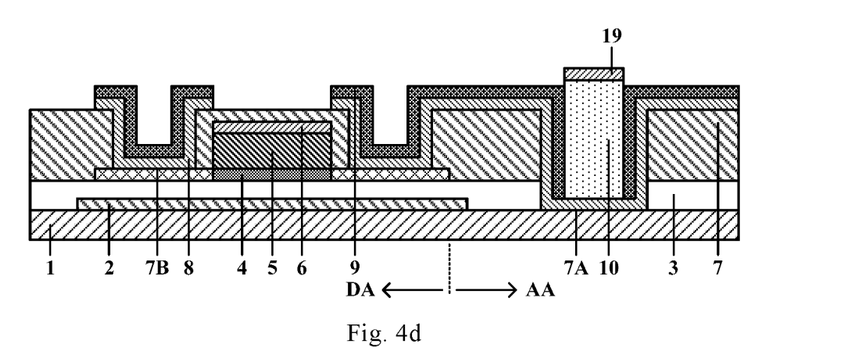

Step S307, as shown in FIG. 4*d*, the source and drain material layer 8' is patterned to form the source and drain layer 8 by wet etching. The source and drain layer 8 for example comprises a common metal like Mo, Al, Ti, Au, Cu, Hf, Ta, and can also be an alloy formed by a Cu process, such as MoNd/Cu/MoNd.

Figure 4E:
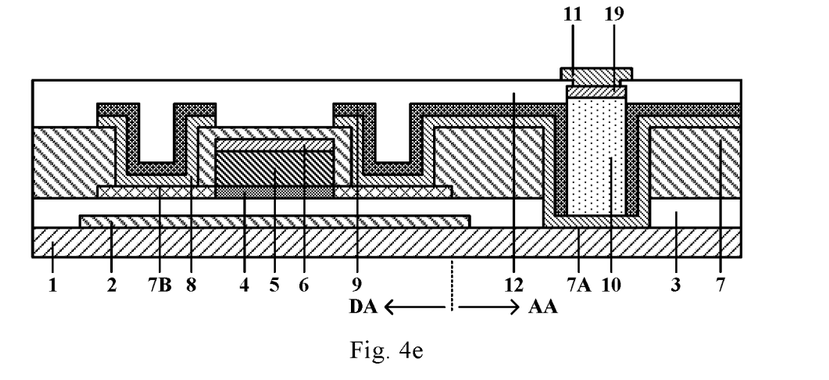

Step S308, as shown in FIG. 4*e*, the second passivation layer 12 is deposited, and a via is formed by patterning. A second transparent conductive material layer is deposited to fill up the via, and the second transparent conductive material layer is patterned to form the second transparent conductive layer 11. The second transparent conductive layer 11 acts as a wiring of the first transparent conductive layer 19.

To this end, the fabrication of the optical sensor device is complete. In the case of a top emitting display device, the subsequent process comprises the following steps S309-S313.

Step S309, as shown in FIG. 1, a black matrix material layer is deposited, and patterned to form the black matrix 13 above the TFT in the non-display region DA.

Step S310, as shown in FIG. 1, the color filter layer 14 is formed in the display region AA. Forming the color filter layer 14 comprises depositing R, G, B color filter units in this order. Each color filter unit adjacent to the black matrix 13 partially covers the black matrix 13, to prevent light leakage and cross-talk.

Step S311, as shown in FIG. 1, the overcoating layer 15 is deposited, and the auxiliary electrode 16 is formed by deposition and patterning. The material for the overcoating layer 15 comprises, but not limited to, a planarization material like resin, SOG (Silicon On Glass, i.e., a silicon—glass bonding structure material) and BCB (benzocyclobutene). The material for the auxiliary electrode 16 can be a common metal like Mo, Al, Ti, Au, Cu, Hf, Ta, or an alloy thereof, such as AlNd, MoNb. The auxiliary electrode 16 can also be a multiple layer metal, such as MoNb/Cu/MoNb, AlNd/Mo/AlNd.

Step S312, as shown in FIG. 1, a photo spacer material layer is deposited on the auxiliary electrode 16 in the non-display region DA, and is patterned to form the photo spacer 17.

Step S313, as shown in FIG. 1, a transparent conductive oxide (TCO) thin film is deposited as the transparent cathode 18. The material for the cathode 18 comprises, but not limited to, a transparent conductive oxide such as AZO, IZO, AZTO, or a combination thereof. For example, the material for the cathode 18 can also be a thin metallic material, such as a compound material like Mg/Ag, Ca/Ag, Sm/Ag, Al/Ag, Ba/Ag.

With the steps as described above, a cover plate for TFT is complete.

In the above implementations, a control TFT with a top-gate self-aligned structure is designed. These implementations are also applicable to an ESL (etch stop layer) type TFT, a BCE (back channel etch) type TFT, or the like. The material for the active layer is an oxide semiconductor like IGZO, and can also be a-Si.

It is noted that, although operations in the method of the present disclosure have been described in a specific sequence in the drawings, this does not require or imply that these operations shall be performed in this specific sequence, and that all of the operations as shown shall be performed to realize the desired result. In contrast, the steps in the flow chart can be performed in other sequences. In addition or alternatively, some steps can be omitted, several steps can be performed as a single step, and/or a single step can be divided into several steps.

Embodiments of the present disclosure further provide a display device, which comprises the optical sensor device in the above embodiments of the present disclosure.

The display device can further comprise:
a black matrix on the optical sensor device;
a color filter layer which covers the photo-sensitive device and partially covers black matrix;
an overcoating layer on the black matrix and the color filter layer;
a photo spacer layer on the overcoating layer;
an auxiliary electrode on the photo spacer layer; and
a transparent cathode which covers the overcoating layer, the photo spacer layer and the auxiliary electrode.

The display device is a top emitting display device or a bottom emitting display device.

Figure 5:
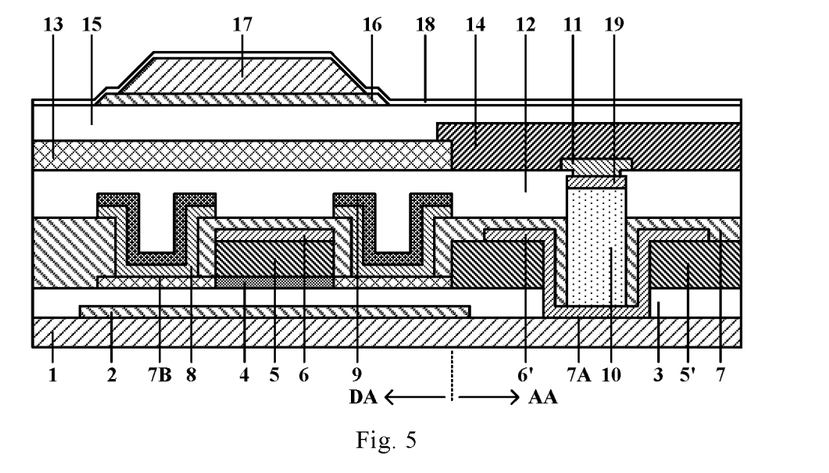
FIG. 5 is a structural view for illustrating an optical sensor device in an embodiment of the present disclosure.

In the optical sensor device shown in FIG. 1, the first through-hole 7A is in the interlayer dielectric layer 7, and at least penetrates a partial thickness of the interlayer dielectric layer 7. For example, the first through-hole 7A penetrates the interlayer dielectric layer 7 and the buffer layer 3. The photo-sensitive device 10 is arranged in the groove formed by the first through-hole 7A. FIG. 5 shows a variant of the optical sensor device. This variant differs from the embodiment shown in FIG. 1 only in the arrangement manner of the first through-hole 7A and the groove in the display region AA. As shown in FIG. 5, in the display region AA, the optical sensor device comprises the buffer layer 3 and a gate insulating material layer 5' which are arranged on the substrate 1 in this order, and the first through-hole 7A penetrating the buffer layer 3 and the gate insulating material layer 5'. The gate insulating material layer 5' is arranged in a same layer as the gate insulating layer 5. A gate material layer 6' is arranged in a same layer as the gate layer 6, and covers the bottom and sidewall of the first through-hole 7A. The interlayer dielectric layer 7 at least covers a portion of the gate material layer 6' which covers the sidewall of the first through-hole 7A, so as to form the groove for accommodating the photo-sensitive device 10. The photo-sensitive device 10 fills up the groove. Namely, the photo-sensitive device 10 is arranged on the gate material layer 6' in the groove, and the interlayer dielectric layer 7 is arranged between the photo-sensitive device 10 and the gate material layer 6' which covers the sidewall of the first through-hole 7A.

It is noted that in the context of the present disclosure, the expression "a first component is arranged in a same layer as a second component" indicates that the first component comprises a material as the second component and is formed by a same pattern process as the second component.

Since the photo-sensitive device 10 is arranged in the groove formed by the first through-hole 7A, the photo-sensitive device 10 is protected by the metal of the gate material layer 6', and the effect of the ambient light on an off-state current of the photo-sensitive device is avoided. The sidewall of the photo-sensitive device 10 is protected by the interlayer dielectric layer 7, so that in subsequent processes of fabricating the TFT, the sidewall of the photo-sensitive device 10 will not be damaged. This improves the performance of the display device.

Similar with the embodiment of FIG. 1, the first through-hole 7A can penetrate a partial thickness of the gate insulating material layer 5', all thickness of the gate insulating material layer 5', all thickness of the gate insulating material layer 5', and a partial thickness of the buffer layer 3, or can penetrate all thickness of the gate insulating material layer 5' and all thickness of the buffer layer 3 (i.e., the case shown in FIG. 5).

Figure 6:
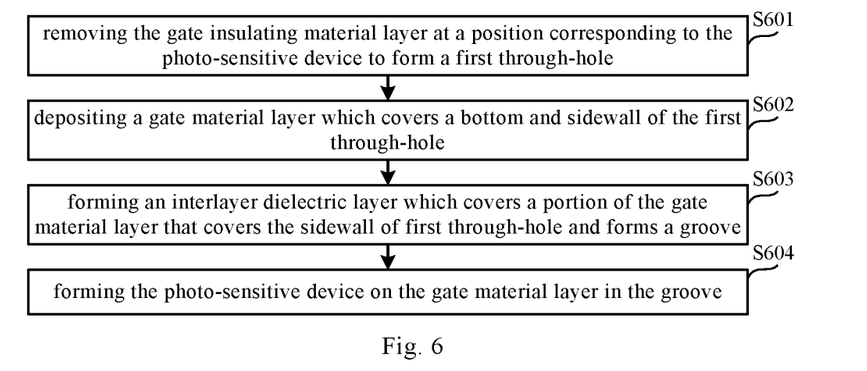
FIG. 6 is a flow chart for illustrating a method for fabricating an optical sensor device in an embodiment of the present disclosure.

The method for fabricating an optical sensor device shown in FIG. 5 will be described below. As shown in FIG. 6, the method for example comprises:

Step S601, removing the gate insulating material layer at a position corresponding to the photo-sensitive device, to form a first through-hole;

Step S602, depositing a gate material layer, which covers a bottom and sidewall of the first through-hole;

Step S603, forming an interlayer dielectric layer on the gate material layer, wherein the interlayer dielectric layer at least covers a portion of the gate material layer that covers the sidewall of the first through-hole, and forms a groove; and Step S604, forming the photo-sensitive device on the gate material layer in the groove.

Embodiments of the present disclosure provide an optical sensor device, a method for fabricating the same, and a display device. Since the photo-sensitive device is arranged in a first through-hole, the photo-sensitive device is protected by a metal in the source and drain layer or the gate layer, so that the effect of the ambient light on an off-state current of the photo-sensitive device is avoided. In addition, since the passivation layer protects the sidewall of the photo-sensitive device, in the subsequent procedure for the TFT, the sidewall of the photo-sensitive device will not be damaged. This improves the performance of the display device, and increases the display effect. By providing the optical sensor device with the photo-sensitive device and the control TFT for optical compensation in the display device, real-time optical compensation can be realized. This effectively restrains the display Mura due to variation in brightness of the EL device, and increases the display effect.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An optical sensor device, comprising:
a display region; and
a non-display region,
wherein the optical sensor device comprises a thin film transistor in the non-display region,
wherein the thin film transistor comprises an active layer, a gate insulating layer, a gate layer, a source and drain layer, and an interlayer dielectric layer,
wherein the gate insulating layer is configured to insulate the active layer from the gate layer, and the interlayer dielectric layer is configured to insulate the gate layer from the source and drain layer,
wherein in the display region, the optical sensor device comprises a first insulating layer, a conductive layer and a second insulating layer stacked sequentially, and
wherein the conductive layer is in a same layer as the source and drain layer or the gate layer, and
wherein in the display region, the first insulating layer comprises a first through-hole,
wherein the optical sensor device further comprises a photo-sensitive device in the first through-hole.

2. The optical sensor device of claim 1,
wherein the conductive layer is on a bottom and on a sidewall of the first through-hole,
wherein the second insulating layer is on at least a portion of the conductive layer which is on the sidewall of the first through-hole, and forms a groove, and
wherein the photo-sensitive device is in the groove.

3. The optical sensor device of claim 2, wherein a depth of the groove is less than or equal to a thickness of the photo-sensitive device.

4. The optical sensor device of claim 2,
wherein the optical sensor device further comprises a buffer layer on a substrate in the display region and the non-display region, and
wherein the first through-hole completely penetrates the first insulating layer and at least partially penetrates the buffer layer.

5. The optical sensor device of claim 2, wherein the optical sensor device comprises a PIN type photo diode, and comprises an N type layer, an I type layer and a P type layer of a semiconductor material stacked sequentially.

6. The optical sensor device of claim 5, wherein the N type layer of the semiconductor material is electrically connected with the conductive layer.

7. The optical sensor device of claim 1, wherein the conductive layer and the source and drain layer are in a same layer, and the first insulating layer and the interlayer dielectric layer are in a same layer.

8. The optical sensor device of claim 7, wherein the optical sensor device further comprises a first passivation layer in the non-display region which overlaps the source and drain layer, and
wherein the second insulating layer and the first passivation layer are in a same layer.

9. The optical sensor device of claim 7, wherein the conductive layer is integral with a source layer or a drain layer of the source and drain layer.

10. The optical sensor device of claim 1,
wherein the conductive layer and the gate layer are in a same layer,
wherein the first insulating layer and the gate insulating layer are in a same layer, and
wherein the second insulating layer and the interlayer dielectric layer are in a same layer.

11. A display device, comprising the optical sensor device of claim 1.

12. The display device of claim 11, further comprising:
a black matrix on the optical sensor device and defines the display region;
a color filter layer in the display region, wherein the color filter layer overlaps the photo-sensitive device and partially overlaps the black matrix;
an overcoating layer on the black matrix and the color filter layer;
a photo spacer layer in the non-display region and on the overcoating layer;
an auxiliary electrode on the photo spacer layer; and
a transparent cathode on the auxiliary electrode, the photo spacer layer and the overcoating layer,
wherein the transparent cathode is electrically connected with the auxiliary electrode.

13. A method for fabricating an optical sensor device, the optical sensor device comprising a display region and a non-display region, and the method comprising:
in the non-display region, sequentially forming an active layer, a gate insulating layer, a gate layer, a source and drain layer and an interlayer dielectric layer, to form a thin film transistor, wherein the gate insulating layer is configured to insulate the active layer from the gate layer, and wherein the interlayer dielectric layer is configured to insulate the gate layer from the source and drain layer; and in the display region, forming a first insulating layer, forming a first through-hole in the first insulating layer, forming a conductive layer and a second insulating layer, and forming a photo-sensitive device in the first through-hole, wherein the conductive layer is in a same layer as the source and drain layer or the gate layer.

14. The method of claim 13, wherein forming the conductive layer comprises:

forming the conductive layer on a bottom and a sidewall of the first through-hole, wherein forming the second insulating layer comprises, forming the second insulating layer to at least overlap a portion of the conductive layer which is on the sidewall of the first through-hole, and form a groove, and wherein forming the photo-sensitive device comprises, forming the photo-sensitive device in the groove.

15. The method of claim 14, further comprising:

prior to forming the active layer, forming a buffer layer on a substrate in the display region and the non-display region, and wherein forming the first through-hole comprises forming the first through-hole to completely penetrate the first insulating layer and at least partially penetrate the buffer layer.

16. The method of claim 13, wherein the conductive layer and the source and drain layer are in a same layer, and wherein the first insulating layer and the interlayer dielectric layer are in a same layer.

17. The method of claim 16, further comprising:

forming the source and drain layer after forming the photo-sensitive device.

18. The method of claim 13, wherein the conductive layer and the gate layer are in a same layer, wherein the first insulating layer and the gate insulating layer are in a same layer, and wherein the second insulating layer and the interlayer dielectric layer are in a same layer.

19. The method of claim 14, wherein a depth of the groove is less than or equal to a thickness of the photo-sensitive device.

20. The method of claim 14, wherein forming the photo-sensitive device comprises:

sequentially depositing an N type layer, an I type layer and a P type layer of a semiconductor material;

depositing a first transparent conductive layer on the P type layer; and patterning the N type layer, the I type layer and the P type layer of the semiconductor material and the first transparent conductive layer, to form the photo-sensitive device.

* * * * *